US012671400B2

(12) United States Patent
Yoshikuni

(10) Patent No.: US 12,671,400 B2
(45) Date of Patent: Jun. 30, 2026

(54) SEMICONDUCTOR INTEGRATED CIRCUIT, APPARATUS INCLUDING THE SAME, AND BUS SYSTEM

(71) Applicant: Masato Yoshikuni, Tokyo (JP)

(72) Inventor: Masato Yoshikuni, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 25 days.

(21) Appl. No.: 19/037,760

(22) Filed: Jan. 27, 2025

(65) Prior Publication Data

US 2025/0286542 A1     Sep. 11, 2025

(30) Foreign Application Priority Data

Mar. 5, 2024     (JP) ................................. 2024-033189

(51) Int. Cl.
*H03K 3/353*       (2006.01)
*G05F 1/46*        (2006.01)
*H03K 5/1252*      (2006.01)

(52) U.S. Cl.
CPC ............... *H03K 3/353* (2013.01); *G05F 1/46* (2013.01); *H03K 5/1252* (2013.01)

(58) Field of Classification Search
None
See application file for complete search history.

(56) References Cited

U.S. PATENT DOCUMENTS

| | | | | | |
|---|---|---|---|---|---|
| 5,161,097 | A | * | 11/1992 | Ikeda | H02M 3/156 363/124 |
| 8,400,014 | B2 | * | 3/2013 | Li | H02J 7/865 307/64 |
| 12,294,304 | B2 | * | 5/2025 | Yang | H02M 3/1582 |
| 2014/0145783 | A1 | | 5/2014 | Ohara et al. | |
| 2018/0342955 | A1 | * | 11/2018 | Tsai | H02M 3/156 |
| 2019/0036443 | A1 | | 1/2019 | Kim et al. | |

FOREIGN PATENT DOCUMENTS

| | | |
|---|---|---|
| EP | 4246761 | 9/2023 |
| JP | 2014-107660 | 6/2014 |

OTHER PUBLICATIONS

Extended European search report mailed on Jul. 1, 2025 with respect to the European patent application No. 25158070.0.

* cited by examiner

*Primary Examiner* — Cassandra F Cox
(74) *Attorney, Agent, or Firm* — IPUSA, PLLC

(57)     ABSTRACT

A semiconductor integrated circuit includes a first backflow prevention circuit provided on a first power line between a first AC filter and a first power output terminal, a bypass line that bypasses the first backflow prevention circuit, a charge pump circuit provided on the bypass line, and a control circuit configured to operate the charge pump circuit such that a current flows into the bypass line and the first power output terminal, when an input voltage between a first power input terminal and a second power input terminal is lower than a first threshold voltage.

12 Claims, 12 Drawing Sheets

FIG.5

SEMICONDUCTOR INTEGRATED CIRCUIT, APPARATUS INCLUDING THE SAME, AND BUS SYSTEM

CROSS-REFERENCE TO RELATED APPLICATIONS

This application claims priority under 35 U.S.C. § 119 to Japanese Patent Application No. 2024-033189, filed Mar. 5, 2024, the contents of which are incorporated herein by reference.

BACKGROUND

1. Technical Field

The present disclosure relates to a semiconductor integrated circuit, an apparatus including the semiconductor integrated circuit, and a bus system.

2. Description of the Related Art

A bus system that transmits differential signals through a pair of wiring lines has been known (Patent Document 1).

RELATED-ART DOCUMENT

Patent Document

Patent Document 1: Japanese Unexamined Patent Application Publication No. 2014-107660

SUMMARY

In a first aspect of the present disclosure, a semiconductor integrated circuit includes:
  a first power input terminal;
  a second power input terminal;
  a first power output terminal;
  a first power line coupling the first power input terminal and the first power output terminal;
  a first AC filter provided on the first power line;
  a first backflow prevention circuit provided on the first power line between the first AC filter and the first power output terminal;
  a bypass line that bypasses the first backflow prevention circuit;
  a charge pump circuit provided on the bypass line; and
  a control circuit configured to operate the charge pump circuit such that a current flows into the bypass line and the first power output terminal, when an input voltage between the first power input terminal and the second power input terminal is lower than a first threshold voltage.
In a second aspect of the present disclosure, an apparatus includes:
  a semiconductor integrated circuit; and
  a load to which power is configured to be supplied from the semiconductor integrated circuit,
  where the semiconductor integrated circuit includes:
    a first power input terminal;
    a second power input terminal;
    a first power output terminal electrically coupled to the load;
    a first power line coupling the first power input terminal and the first power output terminal;
    a first AC filter provided on the first power line;

a first backflow prevention circuit provided on the first power line between the first AC filter and the first power output terminal;
    a bypass line that bypasses the first backflow prevention circuit;
    a charge pump circuit provided on the bypass line; and
    a control circuit configured to operate the charge pump circuit such that a current flows into the bypass line and the first power output terminal, when an input voltage between the first power input terminal and the second power input terminal is lower than a first threshold voltage.
In a third aspect of the present disclosure, a bus system includes:
  a semiconductor integrated circuit in the first aspect; and
  a pair of wiring lines including a first wiring line electrically coupled to the first power input terminal, and a second wiring line electrically coupled to the second power input terminal.

BRIEF DESCRIPTION OF THE DRAWINGS

FIG. 5 is a diagram illustrating the bus system including the semiconductor integrated circuit according to a first embodiment.

DETAILED DESCRIPTION

In the related art relating to bus systems that transmit differential signals via a pair of wiring lines, by applying a DC voltage to the pair of wiring lines, the pair of wiring lines can be used not only as communication lines but also as power lines. In recent years, development has advanced on semiconductor integrated circuits that take DC voltage out from the pair of wiring lines and supply DC current to a load at a subsequent stage.

However, since a voltage input from the pair of wiring lines to a semiconductor integrated circuit fluctuates due to a differential signal that is transmitted over the pair of wiring lines, the voltage may become lower than a voltage that is output from the semiconductor integrated circuit to the load. When the voltage input from the pair of wiring lines to the semiconductor integrated circuit is lower than the voltage output from the semiconductor integrated circuit to the load, current cannot be temporarily supplied from the semiconductor integrated circuit to the load. As a result, power efficiency between the input and output of the semiconductor integrated circuit may decrease.

The present disclosure provides a semiconductor integrated circuit capable of improving power efficiency between the input and output, an apparatus including the semiconductor integrated circuit, and a bus system.

Embodiments of the present disclosure will be described below with reference to the drawings.

Figure 1:
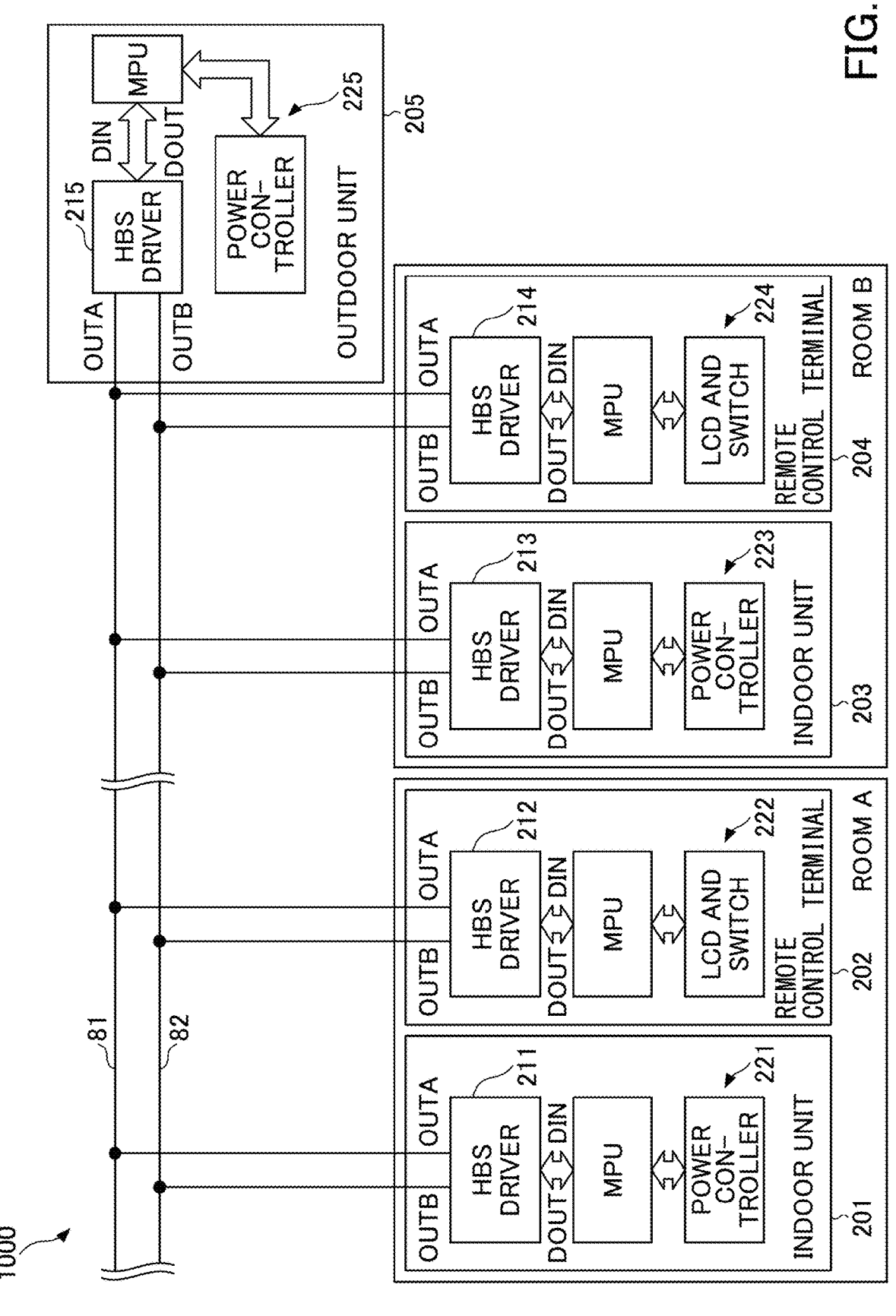
FIG. 1 is a diagram illustrating a bus system to which a semiconductor integrated circuit of the present disclosure can be applied.

FIG. 1 is a diagram illustrating a bus system to which a semiconductor integrated circuit of the present disclosure can be applied. A bus system 1000 shown in FIG. 1 is a communication system including a plurality of drivers (in this example, five drivers 211, 212, 213, 214, and 215 (hereinafter also referred to as drivers 211-215)), which are balanced-connected to one another via a pair of wiring lines 81 and 82. The drivers 211-215 have the same communication interface circuit, and communicate with one another by differential signals that are transmitted over the pair of wiring lines 81 and 82.

FIG. 1 illustrates a case where the bus system 1000 is applied to communication between air conditioning devices. The bus system 1000 includes a plurality of air conditioning devices that are balanced-connected to one another via the pair of wiring lines 81 and 82. FIG. 1 illustrates an indoor unit 201, a remote control terminal 202, an indoor unit 203, a remote control terminal 204 and an outdoor unit 205, as the plurality of air conditioning devices.

The indoor unit 201 has a driver 211 and a load 221, and performs air conditioning of a room A. The remote control terminal 202 has a driver 212 and a load 222, and is an operation terminal for remotely controlling the indoor unit 201. The indoor unit 203 has a driver 213 and a load 223, and performs air conditioning of a room B. The remote control terminal 204 has a driver 214 and a load 224, and is an operation terminal for remotely controlling the indoor unit 203. The outdoor unit 205 has a driver 215 and a load 225, and discharges air to the outside after heat exchange with refrigerant that circulates between the indoor units 201 and 203 and the outdoor unit.

Specific examples of each of the loads 221 and 223 include a processor, such as an MPU (Micro Processing Unit), and a power controller or the like that controls an air conditioning operation of a corresponding indoor unit among the indoor units 201 and 203. Specific examples of each of the loads 222 and 224 include an MPU, a display device such as an LCD (Liquid Crystal Display), and a switch (SW). Specific examples of the load 225 include an MPU and a power controller or the like that controls an operation such as a refrigerant compression operation in the outdoor unit 205.

The drivers 211-215 conform to a home bus system (HBS), but may conform to a bus system different from the HBS. Each of the drivers 211-215 has a terminal OUTA that is connected to the wiring line 81 via a capacitor (not shown), and has a terminal OUTB that is connected to the wiring line 82 via a capacitor (not shown).

Figure 2:
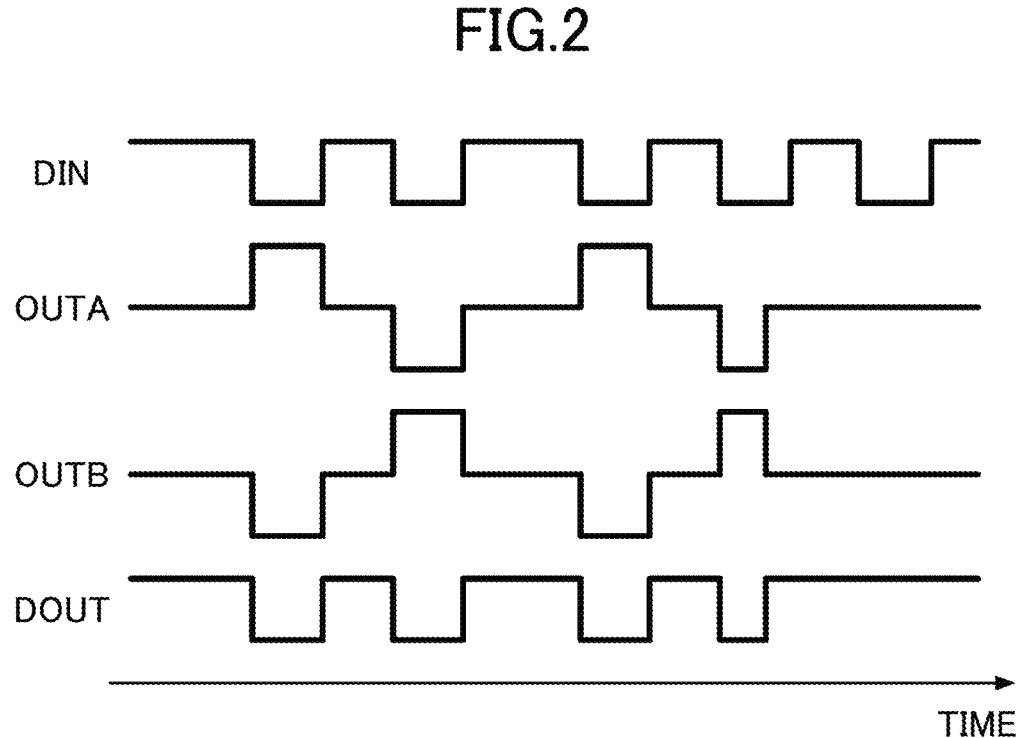
FIG. 2 is a timing chart illustrating waveforms for each part of the bus system.

FIG. 2 is a timing chart illustrating waveforms for each part of the bus system. The bus system 1000 adopts, for example, an AMI (Alternate Mark Inversion) scheme for waveforms of signals that are transmitted between a plurality of devices. Each of the drivers 211-215 has a transmission circuit that converts a square wave signal DIN that is received from a microcomputer such as an MPU, into a pair of differential AMI signals, and that transmits the pair of differential AMI signals from the terminals OUTA and OUTB. Each of the drivers 211-215 may have a reception circuit that converts a pair of differential AMI signals received from the terminals OUTA and OUTB into a square wave signal DOUT, and that transmits the square wave signal to a microcomputer such as an MPU. The AMI signal transmitted or received via the terminal OUTA, and the AMI signal transmitted or received via the terminal OUTB are in opposite phases with respect to each other.

By applying a DC (Direct Current) voltage to the pair of wiring lines 81 and 82 that transmit the differential signals, the pair of wiring lines 81 and 82 can be used not only as communication lines but also as power lines. Hereinafter, the semiconductor integrated circuit that extracts the DC voltage from the pair of wiring lines 81 and 82 and then supplies the DC current to the load of the subsequent stage will be described.

Figure 3:
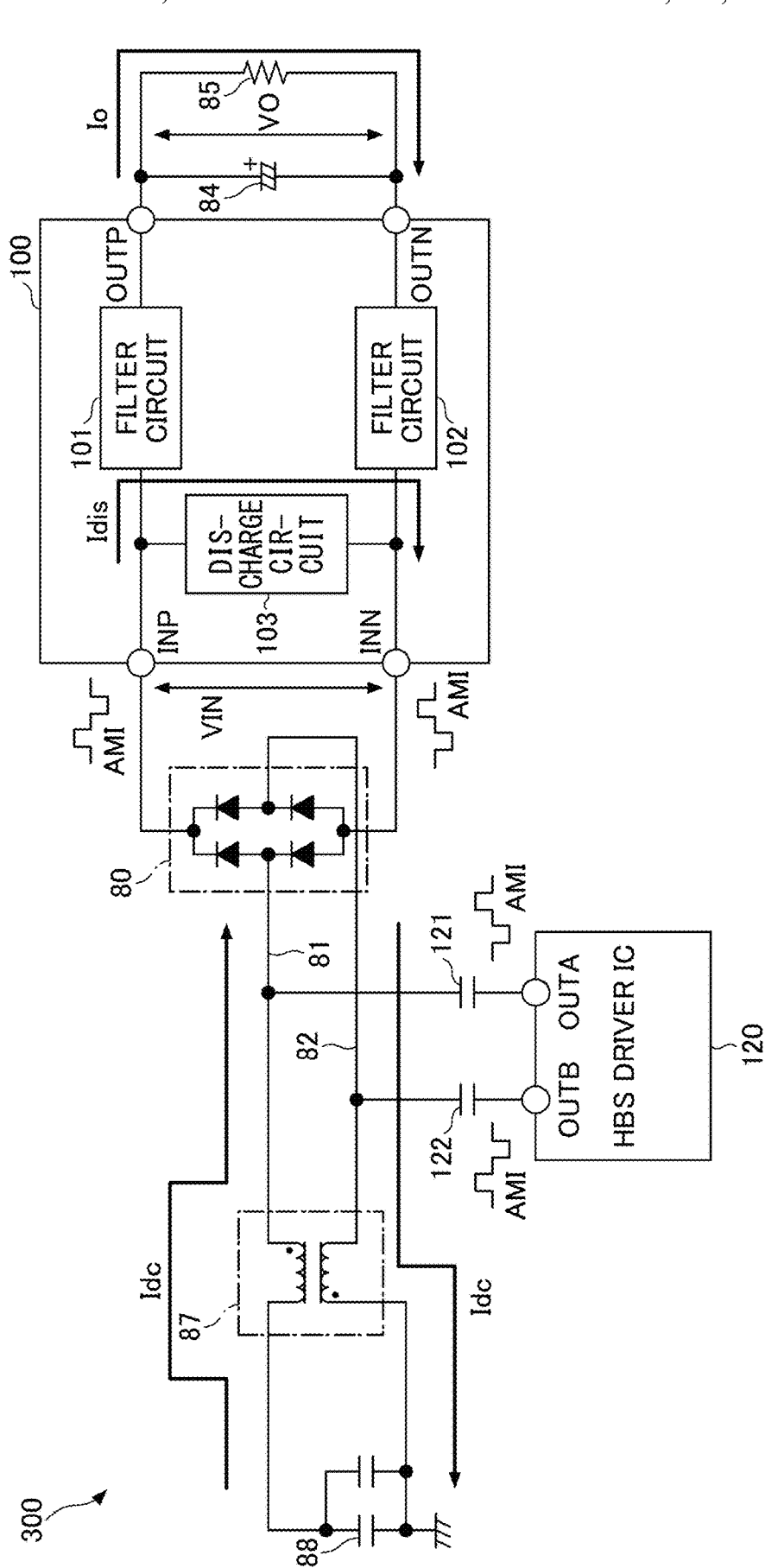
FIG. 3 is a diagram illustrating a bus system including a semiconductor integrated circuit in a first comparative example.

FIG. 3 is a diagram illustrating the bus system including the semiconductor integrated circuit in a first comparative example. A bus system 300 shown in FIG. 3 includes a pair of wiring lines 81 and 82 to which the DC voltage is applied by a DC power supply 88, a choke coil 87 inserted into the pair of wiring lines 81 and 82, and a semiconductor integrated circuit 100 that extracts the DC voltage from the pair of wiring lines 81 and 82. Based on the DC voltage extracted from the pair of wiring lines 81 and 82, the semiconductor integrated circuit 100 supplies a DC output current Io to a load 85 of the subsequent stage.

The semiconductor integrated circuit 100 is provided, for example, in each of a plurality of devices (in FIG. 1, the indoor unit 201, the remote control terminal 202, the indoor unit 203, the remote control terminal 204, and the outdoor unit 205) that transmit and receive differential signals. The semiconductor integrated circuit 100 supplies the DC output current Io to the load 85 (for example, in a case of the semiconductor integrated circuit 100 provided in the indoor unit 201, the load 221 or the driver 211 in the indoor unit 201) in a given device that incorporate the semiconductor integrated circuit 100, for example. The semiconductor integrated circuit 100 is provided, for example, inside or outside a driver (for example, in the case of the semiconductor integrated circuit 100 provided in the indoor unit 201, the driver 211 in the indoor unit 201) in a given device that incorporates the semiconductor integrated circuit 100.

In FIG. 3, the bus system 300 includes, in addition to the semiconductor integrated circuit 100, a driver IC (Integrated Circuit) 120 that is connected to a pair of wiring lines 81 and 82 via respective capacitors 121 and 122, and a diode bridge 80 inserted into the pair of wiring lines 81 and 82. Although one driver IC 120 is shown in FIG. 3, a plurality of driver ICs 120 are electrically connected to the pair of wiring lines 81 and 82 via capacitive coupling. The driver IC 120 is, for example, a semiconductor integrated circuit provided in each of the drivers 211-215 shown in FIG. 1, and transmits or receives the pair of differential AMI signals shown in FIG. 2.

In FIG. 3, the semiconductor integrated circuit 100 includes a first power input terminal (terminal INP), a second power input terminal (terminal INN), a first power output terminal (terminal OUTP), a second power output terminal (terminal OUTN), filter circuits 101 and 102, and a discharge circuit 103.

The semiconductor integrated circuit 100 extracts the DC voltage from a voltage (input voltage VIN) input to the pair of terminals INP and INN, by using the filter circuits 101 and 102, and then the semiconductor integrated circuit 100 outputs the extracted DC voltage as an output voltage VO, from the pair of terminals OUTP and OUTN to the load 85. The output voltage VO is smoothed by a capacitor 84 that is externally attached between the pair of output terminals OUTP and OUTN. The load 85 operates using the output voltage VO as a power supply voltage. When the output voltage VO is output, a DC output current Io (load current) flows into the load 85.

Figure 4:
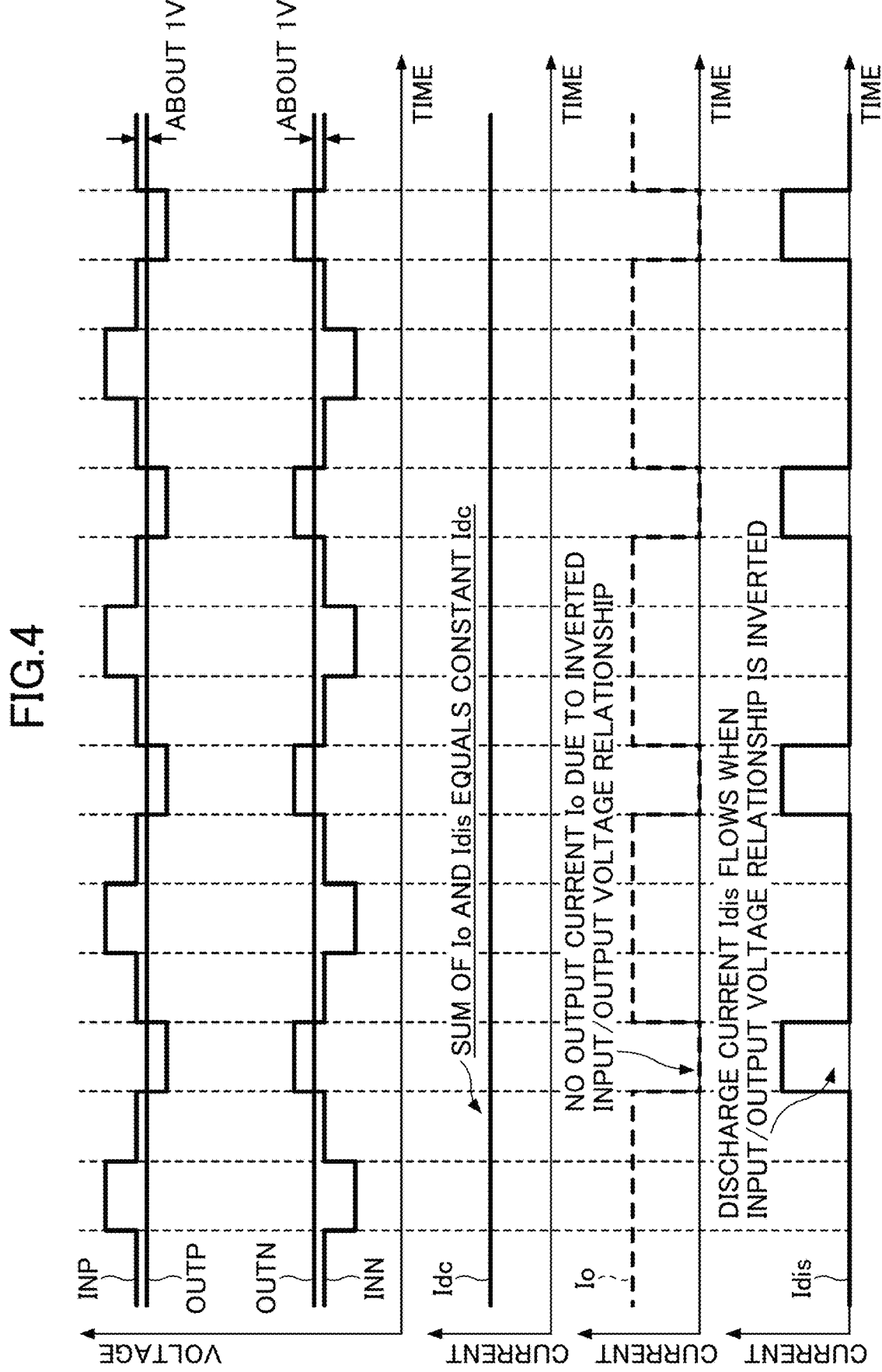
FIG. 4 is a diagram illustrating waveforms for each part of the bus system including the semiconductor integrated circuit in the first comparative example.

FIG. 4 is a diagram illustrating waveforms for each part of the bus system 300 including the semiconductor integrated circuit 100 in the first comparative example shown in FIG. 3. The AMI signal whose phase is opposite to that of the AMI signal input to the terminal INP is input to the terminal INN. The semiconductor integrated circuit 100 extracts the DC voltage from the input voltage VIN, which is a potential difference between the terminals INP and INN, through the filter circuits 101 and 102, and then the semiconductor integrated circuit 100 outputs the DC output voltage VO, which is a potential difference between the pair of terminals OUTP and OUTN, to the load 85.

As a characteristic of the AMI signal, as shown in FIG. 4, a period during which the input voltage VIN becomes lower than the output voltage VO may occur for ¼ of a cycle. During this period, since the potential at the terminal INP becomes lower than the potential at the terminal OUTP, the current stops flowing from the terminal INP to the terminal OUTP. Similarly, since the potential at the terminal INN becomes higher than the potential at the terminal OUTN during such a period, the current stops flowing from the terminal OUTN to the terminal INN. In other words, the output current Io temporarily stops flowing during the above period.

Such a temporary current stop may cause a discrete change in a DC current Idc flowing through the pair of wiring lines 81 and 82. When the discrete change occurs in the DC current Idc, the AMI signal transmitted over the pair of wiring lines 81 and 82 attenuates. In such a situation, continuous current supply is required such that a constant DC current Idc flows. In the semiconductor integrated circuit 100, by flowing a discharge current Idis from the terminal INP via the discharge circuit 103 (see FIG. 3) back to the terminal INN during a period in which the input voltage VIN becomes lower than the output voltage VO, continuous current supply is achieved with respect to the DC current Idc as shown in FIG. 4.

However, since the discharge current Idis, which is not supplied to the load 85, flows for ¼ of the cycle, the current (output current Io) temporarily becomes unable to be supplied from the semiconductor integrated circuit 100 to the load 85. The temporary output interruption of the semiconductor integrated circuit 100 may cause an increase in circuit scale due to lager capacitance of the capacitor 84 that is connected between the pair of terminals OUTP and OUTN. In addition, since the discharge current Idis, which is not supplied to the load 85, flows for ¼ of the cycle, the efficiency of output power relative to input power of the semiconductor integrated circuit 100 becomes less than 75% even at maximum. Further, since a resistor component in the discharge circuit 103 generates heat due to the discharge current Idis, a design that takes into account element destruction due to heat generation is required. In view of the above situation, in the configuration of the semiconductor integrated circuit 100, it may be difficult to apply the semiconductor integrated circuit 100 to applications requiring high input voltage and large current.

Figure 5:
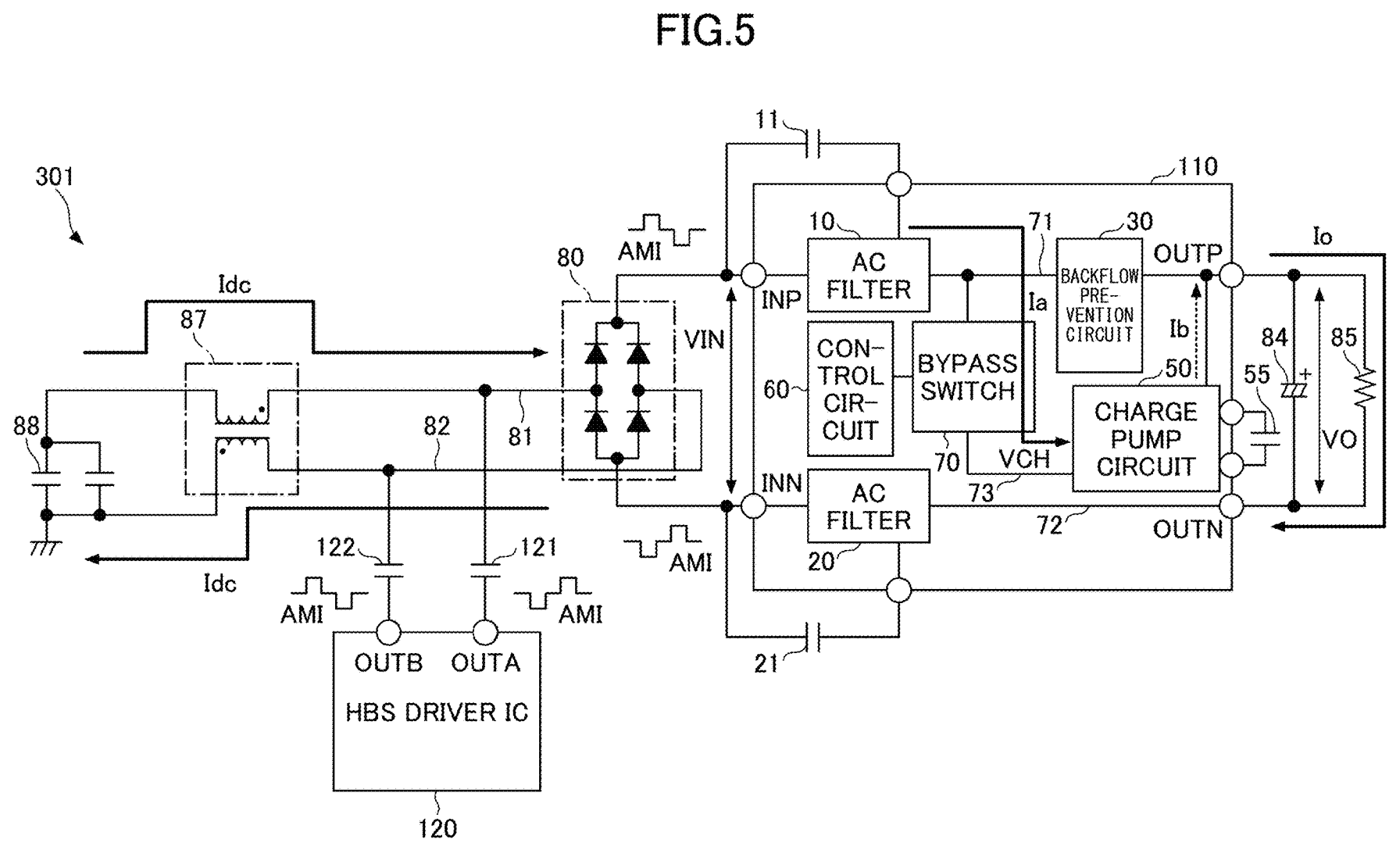

On the other hand, a semiconductor integrated circuit 110 according to a first embodiment shown in FIG. 5 includes a charge pump circuit 50 capable of supplying the current (output current Io) to the load 85, even during the period in which the input voltage VIN becomes lower than the output voltage VO. In this arrangement, continuous current supply to the load 85 and improved power efficiency between the input and output of the semiconductor integrated circuit 110 can be achieved. Further, even during the period in which the input voltage VIN becomes lower than the output voltage VO, the semiconductor integrated circuit 110 includes the charge pump circuit 50 capable of flowing the current between the input and output of the semiconductor integrated circuit 110, and thus continuous current supply with respect to the DC current Idc is achieved.

FIG. 5 is a diagram illustrating the bus system including the semiconductor integrated circuit according to the first embodiment. In the first embodiment shown in FIG. 5, description of the same structure, operation, and effect as described in the first comparative example will be omitted or simplified by referring to the above description.

A bus system 301 shown in FIG. 5 includes a pair of wiring lines 81 and 82 to which the DC voltage is applied by a DC power supply 88, a choke coil 87 inserted into the pair of wiring lines 81 and 82, and a semiconductor integrated circuit 110 that extracts the DC voltage from the pair of wiring lines 81 and 82. The semiconductor integrated circuit 110 supplies the DC output current Io to the load 85 of the subsequent stage, based on the DC voltage extracted from the pair of wiring lines 81 and 82.

A wiring line 81 is an example of a first wiring line that is electrically connected to a first power input terminal (terminal INP). In this example, the terminal INP is electrically connected to a first output terminal of a diode bridge 80 that is inserted into the pair of wiring lines 81 and 82. A wiring line 82 is an example of a second wiring line that is electrically connected to a second power input terminal (terminal INN). In this example, the terminal INN is electrically connected to a second output terminal of the diode bridge 80 inserted into the pair of wiring lines 81 and 82.

In FIG. 5, the semiconductor integrated circuit 110 includes the first power input terminal (terminal INP), the second power input terminal (terminal INN), a first power output terminal (terminal OUTP), a second power output terminal (terminal OUTN), power lines 71 and 72, AC (Alternating Current) filters 10 and 20, a backflow prevention circuit 30, a bypass line 73, a charge pump circuit 50, a bypass switch 70, and a control circuit 60.

The semiconductor integrated circuit 110 extracts the DC voltage from the voltage (input voltage VIN) input to a pair of terminals INP and INN, by using the AC filters 10 and 20, and then the semiconductor integrated circuit 110 outputs the extracted DC voltage as an output voltage VO, from the pair of terminals OUTP and OUTN to the load 85.

The power line 71 is an example of a first power line that connects the first power input terminal (terminal INP) and the first power output terminal (terminal OUTP). The current flows through the power line 71 from the terminal INP to the terminal OUTP.

The power line 72 is an example of a second power line that connects the second power input terminal (terminal INN) and the second power output terminal (terminal OUTN). The current flows through the power line 72 from the terminal OUTN to the terminal INN.

The AC filter 10 is an example of a first AC filter that is provided on the first power line (power line 71). The AC filter 10 is a circuit that behaves like an inductor, and attenuates a signal having a higher frequency than a signal whose frequency is below a predetermined frequency. The AC filter 10 attenuates a high-frequency component of a signal that is input and output from the terminal INP. The AC filter 10 is an integrated circuit that functions like a discrete choke coil.

The AC filter 20 is an example of a second AC filter that is provided on the second power line (power line 72). The AC filter 20 is a circuit that behaves like an inductor, and attenuates a signal having a higher frequency than a signal whose frequency is below a predetermined frequency. The AC filter 20 attenuates a high-frequency component of a signal that is input and output from the terminal INN. The AC filter 20 is an integrated circuit that functions like a discrete choke coil.

The backflow prevention circuit 30 is an example of a first backflow prevention circuit that is provided on the first power line (power line 71) between the first AC filter (AC filter 10) and the first power output terminal (terminal OUTP). The backflow prevention circuit 30 is an integrated circuit that blocks backflow current that flows from the terminal OUTP to the terminal INP.

The bypass line 73 is an example of a bypass line that bypasses the first backflow prevention circuit (backflow prevention circuit 30). The bypass line 73 has one end connected to a portion of the power line 71 between the AC filter 10 and the backflow prevention circuit 30, and has the other end connected to a portion of the power line 71 between the terminal OUTP and the backflow prevention circuit 30. The bypass line 73 is a current path that bypasses the backflow prevention circuit 30.

The charge pump circuit 50 is provided on the bypass line 73. The charge pump circuit 50 is a voltage conversion circuit capable of boosting, stepping down, or inverting the input voltage to the charge pump circuit 50, by using capacitors 55 and 84 that are externally attached to the semiconductor integrated circuit 110. The charge pump circuit 50, for example, boosts an input voltage VCH to the charge pump circuit 50, to thereby output a voltage higher than the input voltage VCH.

The bypass switch 70 is provided on the bypass line 73 between the AC filter 10 and the charge pump circuit 50. The bypass switch 70 is a semiconductor switch such as a MOSFET (Metal-Oxide-Semiconductor Field-Effect Transistor) that is turned on or off by the control circuit 60. The bypass switch 70 may be provided on the bypass line 73 between the terminal OUTP and the charge pump circuit 50.

The control circuit 60 monitors a decrease in the input voltage VIN, and controls a timing of operating the charge pump circuit 50 according to a monitoring result. In this example, the control circuit 60 controls the timing of operating the charge pump circuit 50 by turning on or off the bypass switch 70.

Figure 6:
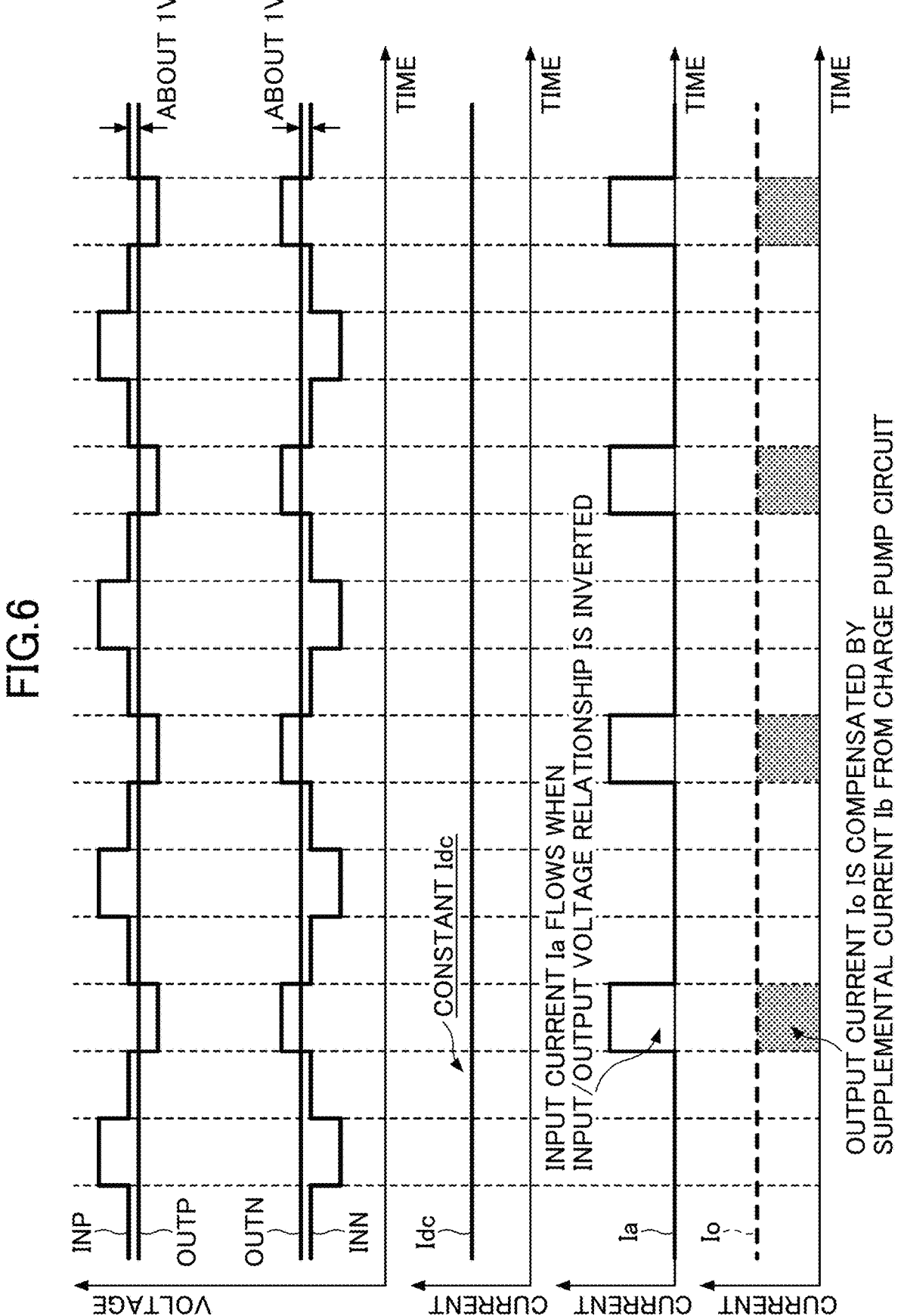
FIG. 6 is a diagram illustrating waveforms for each part of the bus system including the semiconductor integrated circuit according to the first embodiment.

FIG. 6 is a diagram illustrating waveforms for each part of the bus system 301 including the semiconductor integrated circuit 110 according to the first embodiment shown in FIG. 5. The AMI signal whose phase is opposite to that of the AMI signal input to the terminal INP is input to the terminal INN. The semiconductor integrated circuit 110 extracts the DC voltage from the input voltage VIN, which is a potential difference between the terminals INP and INN, by using the AC filters 10 and 20, and then the semiconductor integrated circuit 110 outputs the DC output voltage VO, which is a potential difference between the pair of terminals OUTP and OUTN, to the load 85.

As in the case of the first comparative example, as shown in FIG. 6, a period in which the input voltage VIN becomes lower than the output voltage VO may occur for ¼ of the cycle. When the potential at the terminal INP becomes lower than the potential at the terminal OUTP, the current stops flowing from the terminal INP to the terminal OUTP. Similarly, when the potential at the terminal INN becomes higher than the potential at the terminal OUTP, the current stops flowing from the terminal OUTN to the terminal INN.

The control circuit 60 according to the first embodiment compares the input voltage VIN with a first voltage (hereinafter also referred to as a "voltage V1"), and determines that the input voltage VIN is lower than the output voltage VO when the input voltage VIN is lower than the voltage V1. The voltage V1 is, for example, a threshold voltage that is generated in the control circuit 60. The control circuit 60 turns the bypass switch 70 on when the input voltage VIN is lower than the voltage V1. By turning the bypass switch 70 on, the control circuit 60 operates the charge pump circuit 50 such that a supplemental current Ib from the charge pump circuit 50 flows into the bypass line 73 and the terminal OUTP.

In such a manner, by operating the charge pump circuit 50, the output current Io is complemented by a supplemental current Ib during a period in which the input voltage VIN is lower than the output voltage VO, and thus continuous current supply to the load 85 is achieved. In this arrangement, it is possible to reduce the circuit scale by reducing the capacitance of the capacitor 84 that is connected between the pair of terminals OUTP and OUTN. Moreover, during the period in which the input voltage VIN is lower than the output voltage VO, the supplemental current Ib is output from the semiconductor integrated circuit 110 toward the load 85, and thus the efficiency of the output power relative to the input power of the semiconductor integrated circuit 110 is improved compared with the first comparative example. Further, since the discharge circuit 103 as illustrated in the first comparative example is not required, heat generation is suppressed. This makes it easy to apply the system to applications requiring high input voltage and large current. Moreover, a range (variety) of packages that can be selected to house the semiconductor integrated circuit 110 can be selected expands.

Moreover, by the operation of the charge pump circuit 50 in the above manner, the input current Ia to the charge pump circuit 50, and the supplemental current Ib output from the charge pump circuit 50 flow into the bypass line 73 during the period in which the input voltage VIN is lower than the output voltage VO. In this arrangement, even during the period in which the input voltage VIN is lower than the output voltage VO, the current can flow between the input and output of the semiconductor integrated circuit 110 by bypassing the backflow prevention circuit 30, and thus continuous current supply with respect to the DC current Idc is achieved. The input current Ia is the current that is input from the terminal INP to the charge pump circuit 50 via the bypass switch 70. The supplemental current Ib is the current that is supplied from the charge pump circuit 50 to the terminal OUTP.

When the input voltage VIN is higher than the voltage V1, the control circuit 60 shuts off the bypass line 73 by turning off the bypass switch 70. By turning the bypass switch 70 off, the control circuit 60 stops the operation of the charge pump circuit 50 such that the supplemental current Ib from the charge pump circuit 50 flows into the bypass line 73 and the terminal OUTP. In this arrangement, during a period in which the input voltage VIN is higher than the output voltage VO, no current flows through the bypass line 73, and the current can flow between the input and output of the semiconductor integrated circuit 110 via the backflow prevention circuit 30. As a result, continuous current supply with respect to the DC current Idc is achieved.

Figure 7:
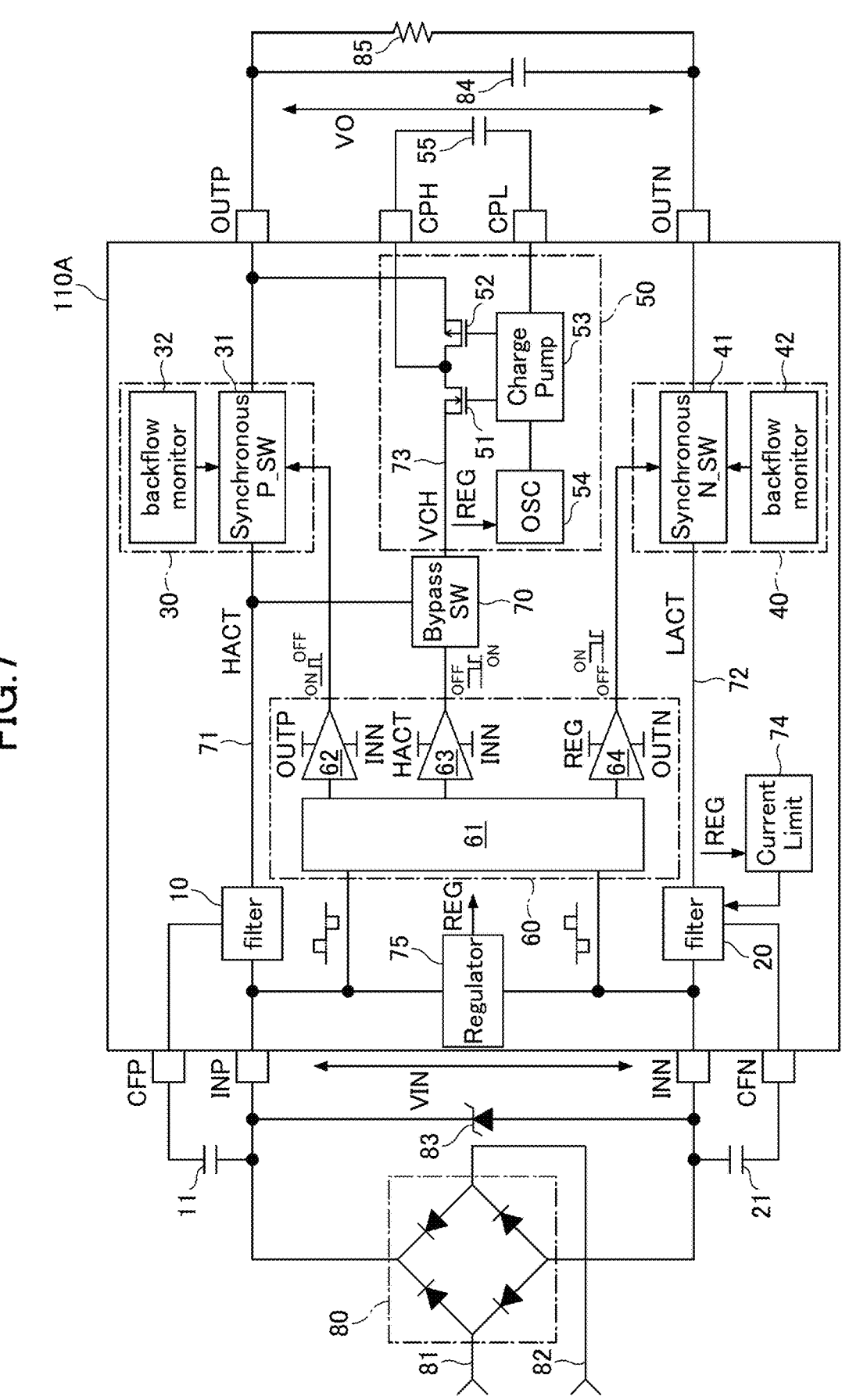
FIG. 7 is a diagram illustrating a first configuration example of the semiconductor integrated circuit according to the first embodiment.

FIG. 7 is a diagram showing a first configuration example of the semiconductor integrated circuit according to the first embodiment. A semiconductor integrated circuit 110A shown in FIG. 7 is one embodiment of the semiconductor integrated circuit 110. The semiconductor integrated circuit 110A further includes a first capacitor connection terminal (terminal CFP), a second capacitor connection terminal (terminal CFN), a backflow prevention circuit 40, a regulator 75, and an overcurrent protection circuit 74.

A capacitor 11 is a capacitive element that is externally attached between the terminal CFP and the terminal INP. A filter characteristic of the AC filter 10 can be adjusted by a capacitance value of the capacitor 11. A capacitor 21 is a capacitive element that is externally attached between the terminal CFN and the terminal INN. A filter characteristic of the AC filter 20 can be adjusted by a capacitance value of the capacitor 21. A Zener diode 83 is an element that is externally attached between the terminal INP and the terminal INN. A surge resistance between the terminal INP and the terminal INN can be adjusted by a Zener voltage of the Zener diode 83.

The regulator 75 is a circuit that generates a constant voltage REG based on the input voltage VIN. Each circuit in the semiconductor integrated circuit 110A operates based on the constant voltage REG.

The backflow prevention circuit 40 is an example of a second backflow prevention circuit that is provided on a second power line (power line 72) between a second AC filter (AC filter 20) and a second power output terminal (terminal OUTN). The backflow prevention circuit 40 is an integrated circuit that blocks backflow current flowing from the terminal INN into the terminal OUTN.

The backflow prevention circuit 30 has a synchronous switch 31 inserted into the power line 71, and has a backflow monitoring circuit 32 that monitors the backflow current flowing through the synchronous switch 31. The synchronous switch 31 (P_SW) is, for example, a P-channel MOSFET. The backflow monitoring circuit 32 monitors the voltage across the synchronous switch 31, and turns the synchronous switch 31 off when a polarity of the voltage is inverted. This prevents the backflow current from flowing through the power line 71. The synchronous switch 31 may be turned off by the control circuit 60 when the input voltage VIN is lower than the voltage V1, and may be turned on by the control circuit 60 when the input voltage VIN is higher than the voltage V1.

The backflow prevention circuit 40 has a synchronous switch 41 inserted into the power line 72, and has a backflow monitoring circuit 42 that monitors the backflow current flowing through the synchronous switch 41. The synchronous switch 41 (N_SW) is, for example, an N-channel MOSFET. The backflow monitoring circuit 42 monitors the voltage across the synchronous switch 41, and turns the synchronous switch 41 off when the polarity of the voltage is inverted. This prevents the backflow current from flowing through the power line 72. The synchronous switch 41 need not be turned off by the control circuit 60, depending on the magnitude of the input voltage VIN.

The overcurrent protection circuit 74 monitors the current flowing through the power line 72, and shuts off the power line 72 when the current exceeding a predetermined value is detected. In this arrangement, the overcurrent protection circuit 74 protects the semiconductor integrated circuit 110A from the overcurrent flowing through the power line 72.

The charge pump circuit 50 has an oscillator 54 (OSC), a switch control circuit 53, and switches 51 and 52. The switch control circuit 53 controls the charging and discharge of the capacitor 55 by controlling the on or off state of the switches 51 and 52 according to a pulse signal from the oscillator 54. In this arrangement, even during the period in which the input voltage VIN is lower than the output voltage VO, the current flows through a path of the terminal INP, the AC filter 10, the bypass switch 70, the charge pump circuit 50, the terminal OUTP, and the load 85, which are arranged in this order.

The input voltage VCH, which is a power supply voltage for the charge pump circuit 50, is controlled by the bypass switch 70 based on an output voltage HACT of the AC filter 10. The illustrated charge pump circuit 50 is a double booster circuit, and in this case, an input voltage VCH is controlled to be half of the input voltage VIN. As a result, the semiconductor integrated circuit 110A can make the output voltage VO follow the input voltage VIN such that the output voltage VO becomes equal to the input voltage VIN.

The control circuit 60 has a detection circuit 61 connected to the pair of terminals INP and INN, and has drive circuits 62, 63, and 64 to each of which a detection signal representing a detection result obtained by the detection circuit 61 is input. The detection circuit 61 detects a decrease in the input voltage VIN. The detection circuit 61 may detect a decrease in the input voltage VIN by detecting a decrease in the internal current flowing between the pair of terminals INP and INN via the detection circuit 61.

The drive circuit 63 controls the on or off state of the bypass switch 70. The drive circuit 62 controls the on or off state of the synchronous switch 31. The drive circuit 64 controls the on or off state of the synchronous switch 41.

Figure 8:
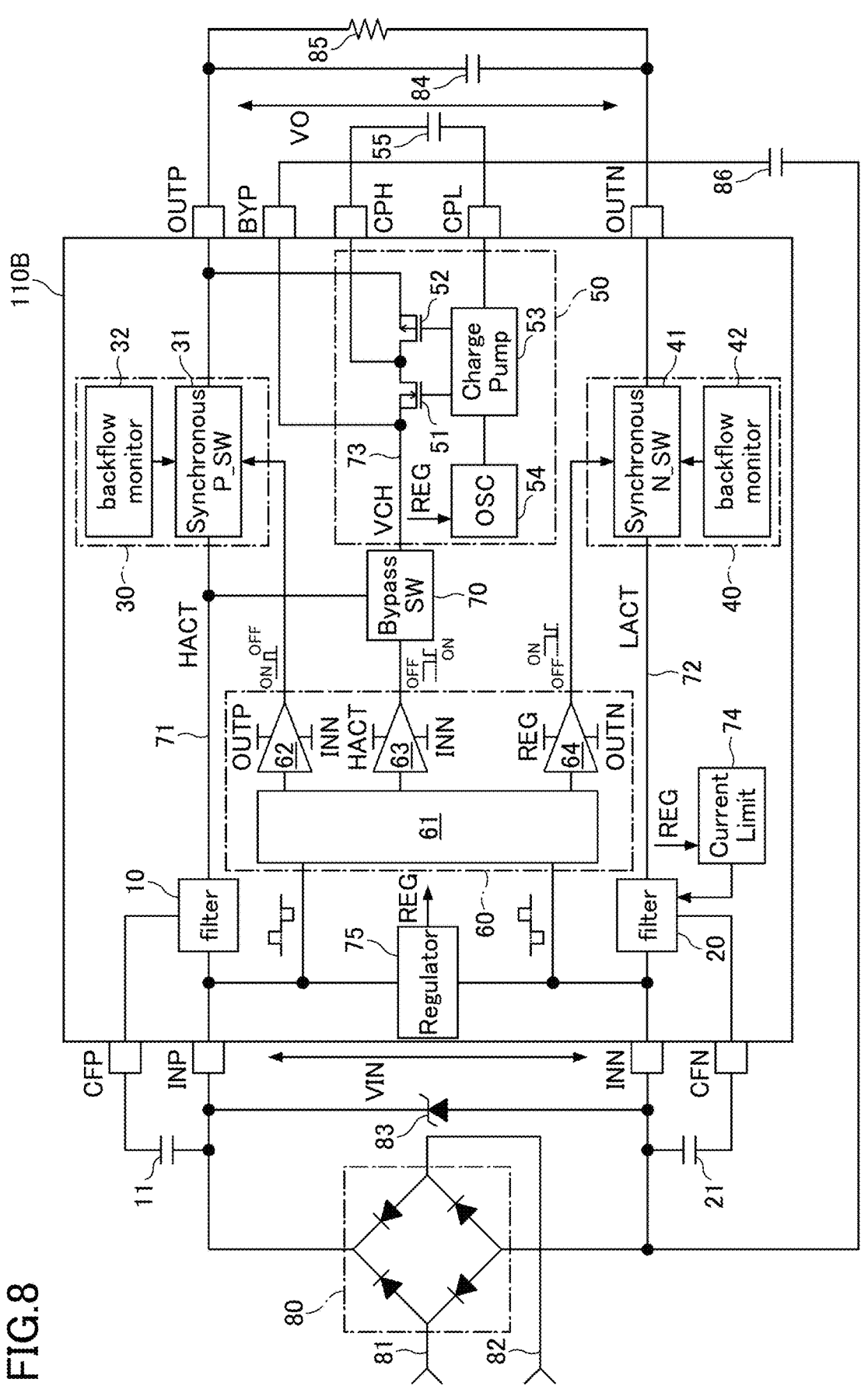
FIG. 8 is a diagram illustrating a second configuration example of the semiconductor integrated circuit according to the first embodiment.

FIG. 8 is a diagram showing a second configuration example of the semiconductor integrated circuit according to the first embodiment. A semiconductor integrated circuit 110B shown in FIG. 8 is a modification of the semiconductor integrated circuit 110A. The semiconductor integrated circuit 110B differs from the semiconductor integrated circuit 110A in that a bypass terminal (terminal BYP) and a capacitor 86 are added.

The terminal BYP is a terminal for capacitive element connection that is internally connected between the bypass switch 70 and an input portion of the charge pump circuit 50. The capacitor 86 is a capacitive element that is externally attached between the terminal BYP and the terminal INN. The stability of the input voltage VCH, which serves as the power supply voltage for the charge pump circuit 50, is improved by the external connection of the capacitor 86.

Figure 9:
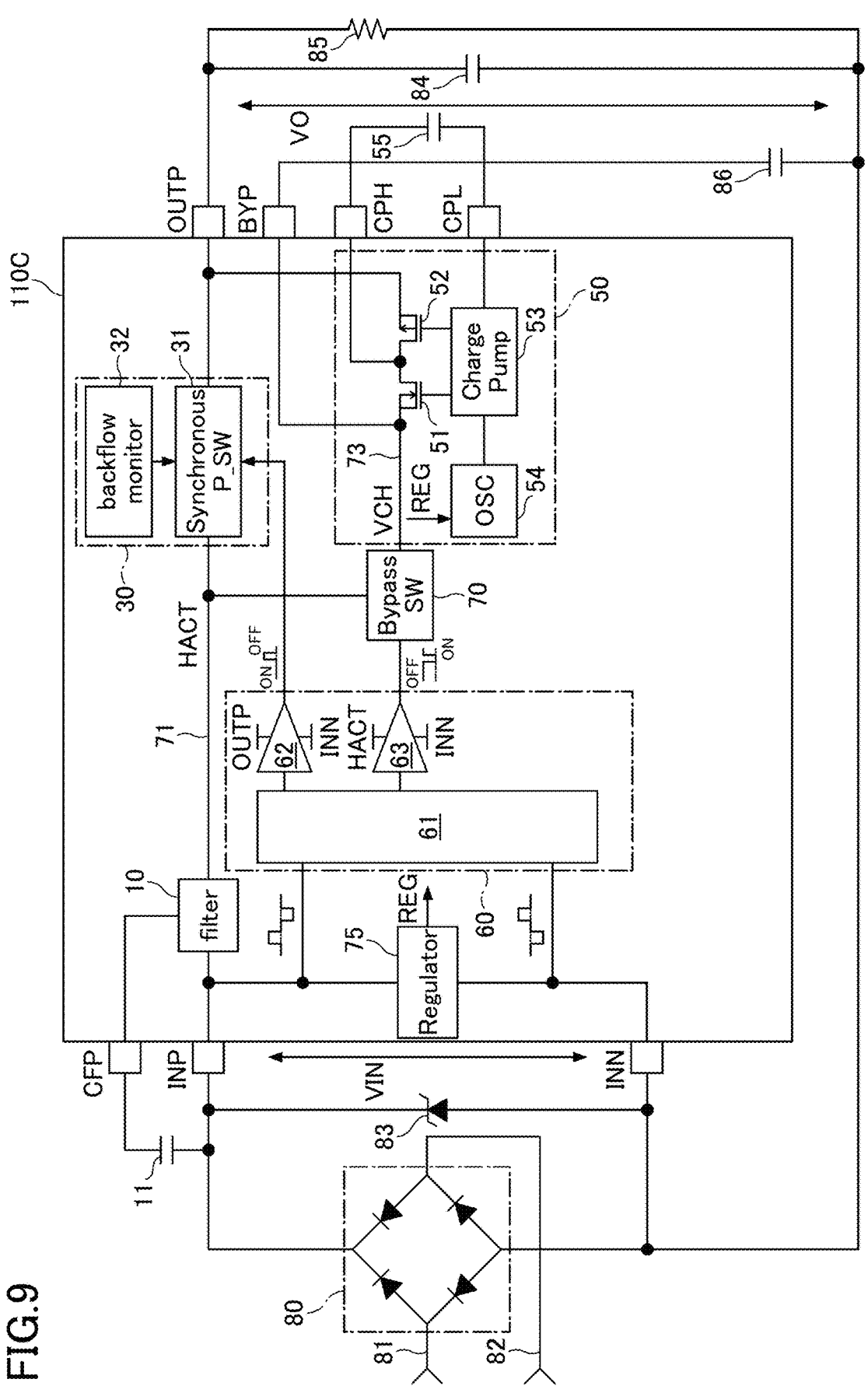
FIG. 9 is a diagram showing a third configuration example of the semiconductor integrated circuit according to the first embodiment.

FIG. 9 is a diagram showing a third configuration example of the semiconductor integrated circuit according to the first embodiment. A semiconductor integrated circuit 110C shown in FIG. 9 is a modification of the semiconductor integrated circuit 110B. The semiconductor integrated circuit 110C differs from the semiconductor integrated circuit 110B in that the semiconductor integrated circuit 110C does not have the terminal OUTN, the power line 72, the AC filter 20, and the backflow prevention circuit 40. The terminal BYP and the capacitor 86 may be omitted.

Each of the semiconductor integrated circuits 110A and 110B has a two-channel filter configuration of INP-OUTP and INN-OUTN, while the semiconductor integrated circuit 110C has a single-channel filter configuration of INP-OUTP.

Figure 10:
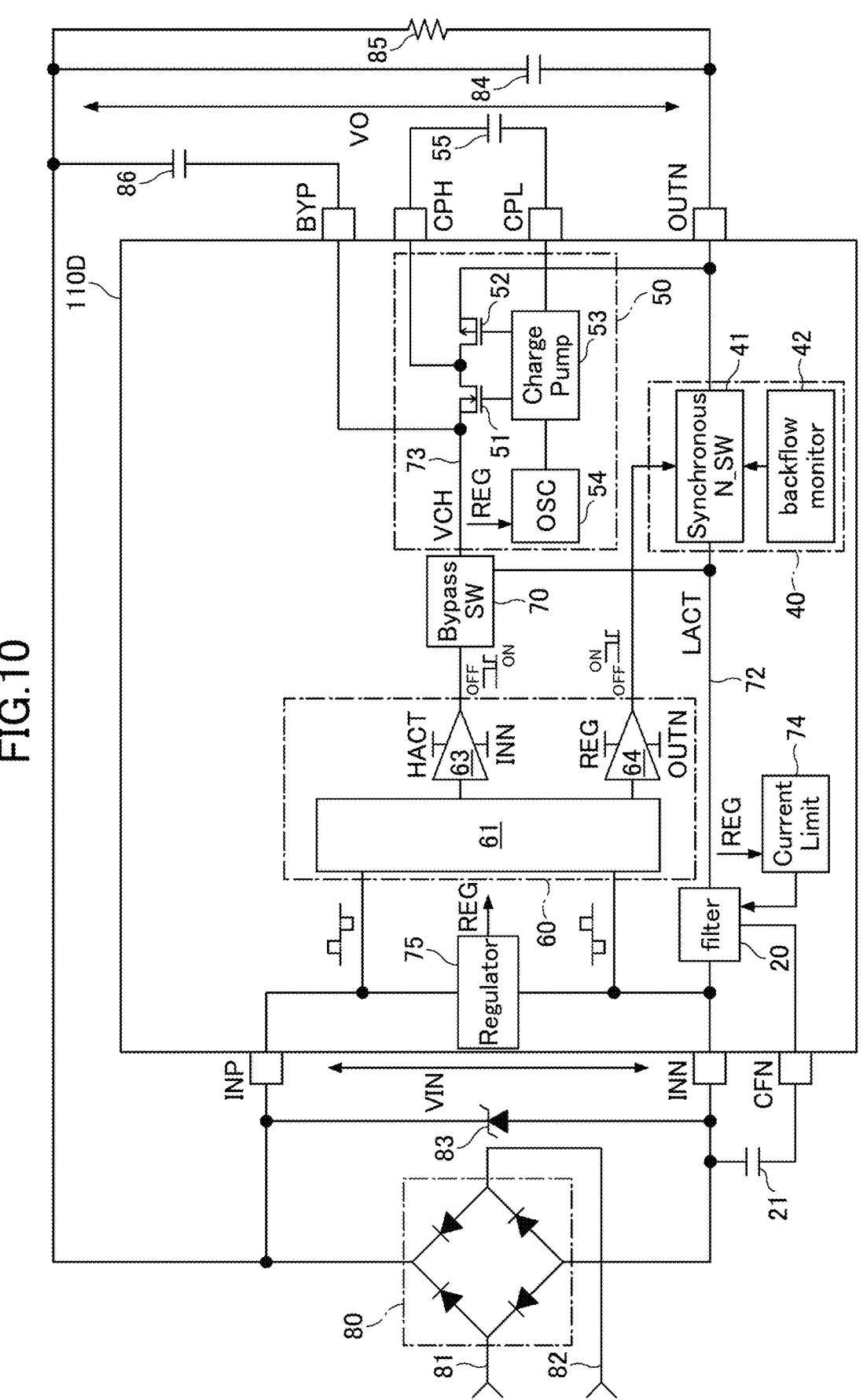
FIG. 10 is a diagram showing a fourth configuration example of the semiconductor integrated circuit according to the first embodiment.

FIG. 10 is a diagram showing a fourth configuration example of the semiconductor integrated circuit according to the first embodiment. A semiconductor integrated circuit 110D shown in FIG. 10 is a modification of the semiconductor integrated circuit 110B. The semiconductor integrated circuit 110D differs from the semiconductor integrated circuit 110B in that the semiconductor integrated circuit 110D does not have the terminal OUTP, the power line 71, the AC filter 10, and the backflow prevention circuit 40. The terminal BYP and the capacitor 86 may be omitted.

Contrary to the semiconductor integrated circuit 110C, the semiconductor integrated circuit 110D has a single-channel filter configuration of INN-OUTN.

In FIG. 10, unlike the semiconductor integrated circuit 110A or the like, the terminal INN is an example of a first power input terminal, the terminal INP is an example of a second power input terminal, the terminal OUTN is an example of a first power output terminal, the power line 72 is an example of a first power line, the AC filter 20 is an example of a first AC filter, and the backflow prevention circuit 40 is an example of a first backflow prevention circuit.

The charge pump circuit 50 in FIG. 10 is a circuit that generates a negative voltage. When the input voltage VIN is lower than the voltage V1, the control circuit 60 operates the charge pump circuit 50 by turning the bypass switch 70 on, thereby allowing the supplemental current Ib from the charge pump circuit 50 to flow into the bypass line 73 and the terminal OUTN. In this arrangement, even during the period in which the input voltage VIN is lower than the output voltage VO, the current flows through a path of the load 85, the terminal OUTN, the charge pump circuit 50, the bypass switch 70, the AC filter 20, and the terminal INN, which are arranged in this order.

Figure 11:
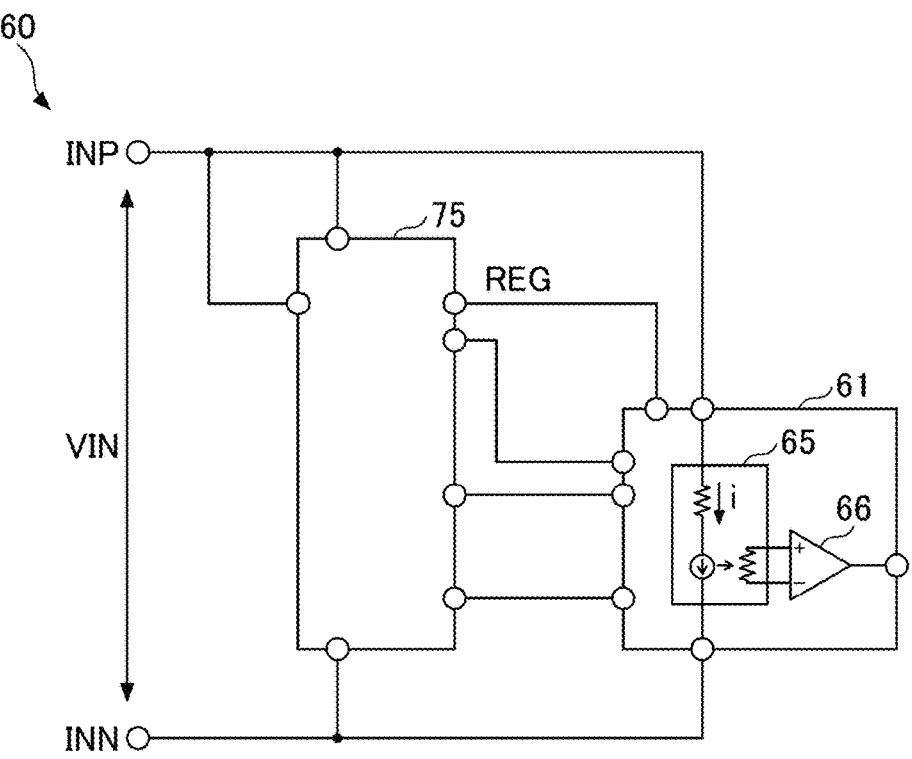
FIG. 11 is a diagram illustrating a portion of a control circuit provided in the semiconductor integrated circuit.

FIG. 11 is a diagram illustrating a portion of the control circuit provided in the semiconductor integrated circuit. The detection circuit 61 in the control circuit 60 operates based on the constant voltage REG that is generated by the regulator 75. The detection circuit 61 has a current detection circuit 65 that detects an internal current i flowing between the terminal INP and the terminal INN, and has a comparator circuit 66 that compares the internal current i detected by the current detection circuit 65 with a first threshold current (hereinafter also referred to as a "current I1"). The internal current i is proportional to the input voltage VIN. The internal current i decreases in accordance with a decreasing input voltage VIN.

When the internal current i detected by the current detection circuit 65 is smaller than the current I1 due to a decrease in the input voltage VIN, the comparator circuit 66 determines that the input voltage VIN is lower than the voltage V1. When the internal current i is smaller than the current I1, the comparator circuit 66 outputs a signal to operate the charge pump circuit 50 as described above. In this arrangement, the current is supplied to the load 85 even when the input voltage VIN is lower than the output voltage VO. On the other hand, when the internal current i is larger than the current I1, the comparator circuit 66 outputs a signal to stop the operation of the charge pump circuit 50. In this arrangement, the current flowing into the bypass line 73 stops.

Figure 12:
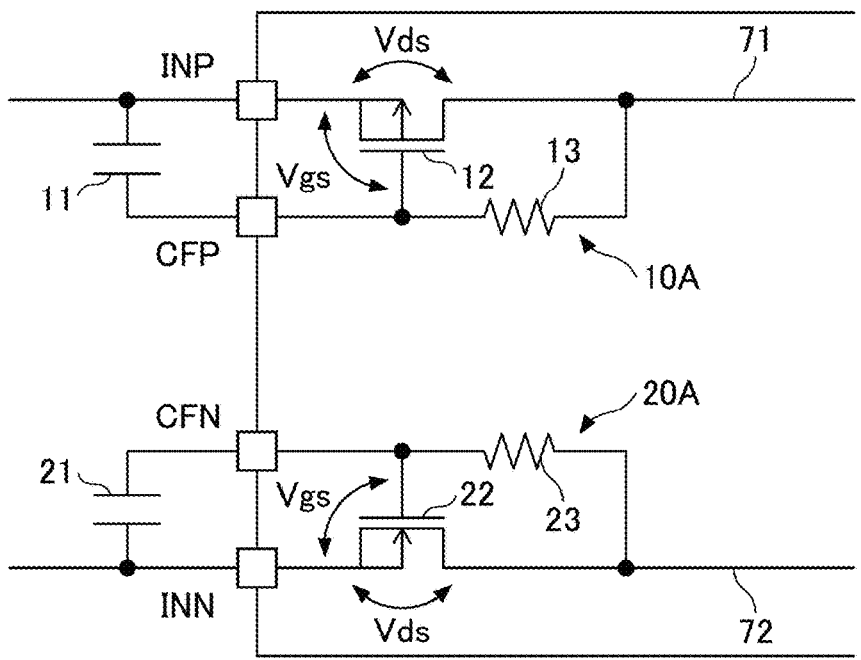
FIG. 12 is a diagram illustrating a first configuration example of an AC filter provided in the semiconductor integrated circuit.

FIG. 12 is a diagram showing a first configuration example of the AC filter provided in the semiconductor integrated circuit. An AC filter 10A is an example of the AC filter 10 described above. An AC filter 20A is an example of the AC filter 20 described above.

The AC filter 10A is an active inductor having (i) a P-channel MOS transistor 12 inserted in series into the power line 71 and (ii) a resistor 13 connected between a gate and a drain of the MOS transistor 12. The MOS transistor 12 has a source connected to a terminal INP and a gate connected to a terminal CFP. A drain-source voltage Vds of the MOS transistor 12 is determined by a gate-source voltage Vgs of the MOS transistor 12. The impedance of the AC filter 10A can be adjusted by a capacitance value of the capacitor 11.

The AC filter 20A is an active inductor having (i) an N-channel MOS transistor 22 inserted in series into the power line 72 and (ii) a resistor 23 connected between a gate and a drain of the MOS transistor 22. In the MOS transistor 22, a source is connected to a terminal INN, and the gate is connected to a terminal CFN. A drain-source voltage Vds of the MOS transistor 22 is determined by a gate-source voltage Vgs of the MOS transistor 22. The impedance of the AC filter 20A can be adjusted by a capacitance value of the capacitor 21.

Figure 13:
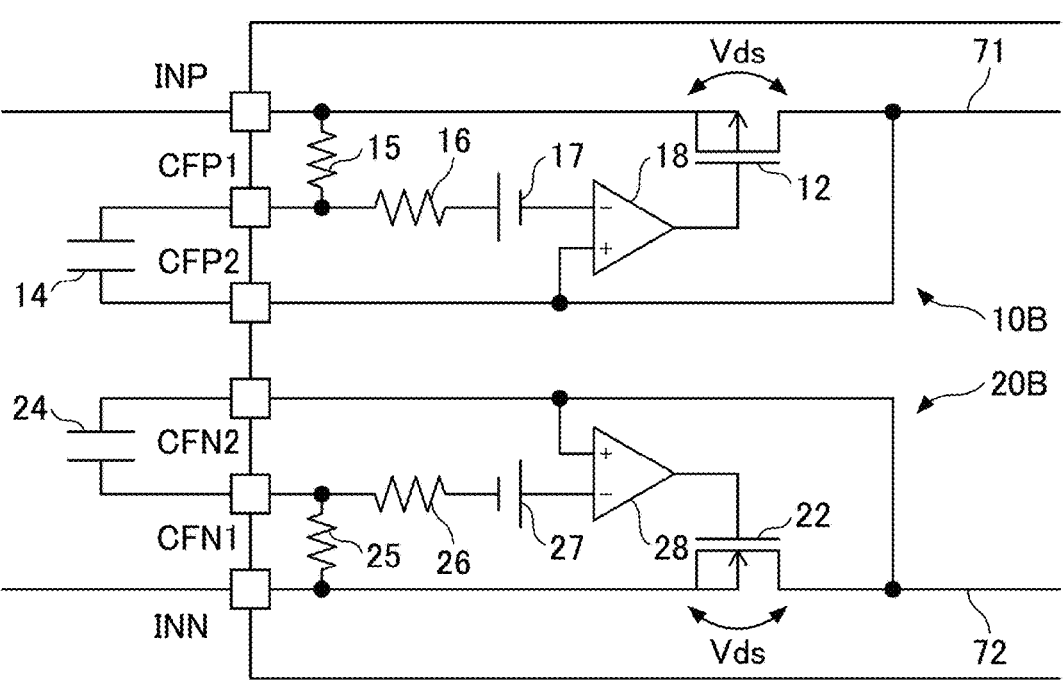
FIG. 13 is a diagram illustrating a second configuration example of the AC filter provided in the semiconductor integrated circuit.

FIG. 13 is a diagram showing a second configuration example of the AC filter provided in the semiconductor integrated circuit. An AC filter 10B is an example of the AC filter 10 described above. An AC filter 20B is an example of the AC filter 20 described above.

The AC filter 10B is a filter amplifier having a MOS transistor 12, resistors 15 and 16, a voltage source 17, and an operational amplifier 18. The resistor 15 is connected between the terminal INP and a terminal CFP1. The resistor 16 and the voltage source 17 are connected between the terminal CFP1 and an inverted input terminal of the operational amplifier 18. The output of the operational amplifier 18 is connected to the gate of the MOS transistor 12. A non-inverted input terminal of the operational amplifier 18 is connected to a terminal CFP2 and the drain of the MOS transistor 12. A capacitor 14 is externally attached between a pair of terminals CFP1 and CFP2 that are provided in the semiconductor integrated circuit. In this arrangement, the drop of voltage Vds between the drain and source of the MOS transistor 12 is reduced, thereby reducing loss and improving the efficiency between the input and output. The impedance of the AC filter 10B can be adjusted by a capacitance value of the capacitor 14.

The AC filter 20B is a filter amplifier having a MOS transistor 22, resistors 25 and 26, a voltage source 27, and an operational amplifier 28. The resistor 25 is connected between the terminal INN and a terminal CFN1. The resistor 26 and the voltage source 27 are connected between the terminal CFN1 and an inverted input terminal of the operational amplifier 28. The output of the operational amplifier 28 is connected to the gate of the MOS transistor 22. A non-inverted input terminal of the operational amplifier 28 is connected to a terminal CFN2 and the drain of the MOS transistor 22. A capacitor 24 is externally attached between a pair of terminals CFN1 and CFN2 that are provided in the semiconductor integrated circuit. In this arrangement, the drop of the voltage Vds between the drain and source of the MOS transistor 22 is reduced, thereby reducing the loss and improving the efficiency between the input and output. The impedance of the AC filter 20B can be adjusted by a capacitance value of the capacitor 24.

Figure 14:
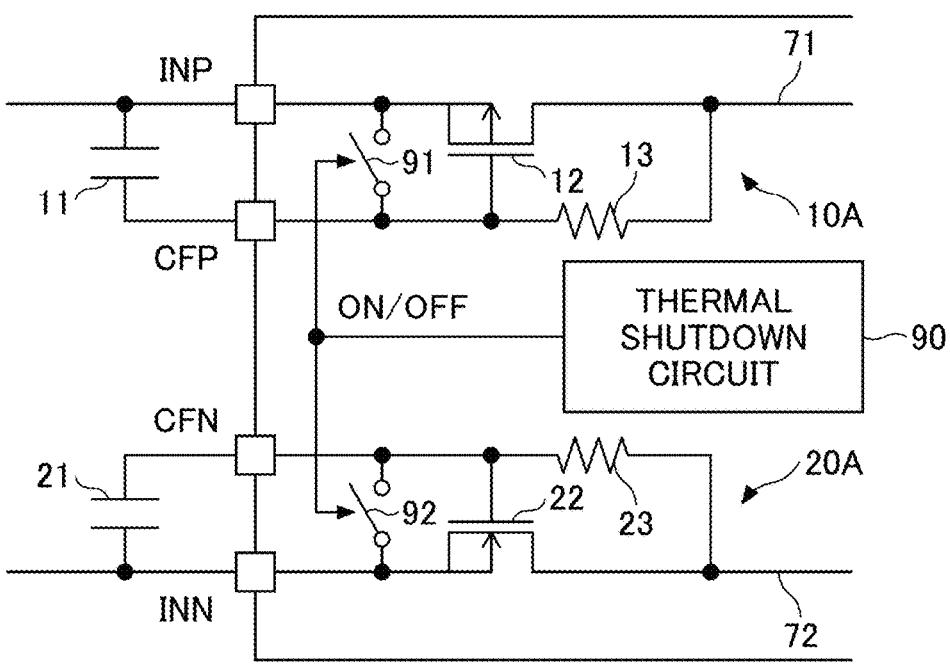
FIG. 14 is a diagram illustrating a circuit that implements thermal shutdown.

FIG. 14 is a diagram illustrating a circuit that implements thermal shutdown. The semiconductor integrated circuit may be provided with a thermal shutdown circuit 90 that detects overheating and cuts off the current flowing between the input and output of the semiconductor integrated circuit. In this arrangement, thermal protection of the semiconductor integrated circuit is achieved. For example, when detecting overheating, the thermal shutdown circuit 90 turns off at least one of a switch 91 connected between the gate and source of the MOS transistor 12 or a switch 92 connected between the gate and source of the MOS transistor 22. As a result, the overheating is suppressed because the current flowing through the power lines 71 and 72 is cut off.

Although the embodiments are described above, the embodiments are presented as examples, and the present disclosure is not limited to the above embodiments. The embodiments can be implemented in various other forms, and various combinations, omissions, substitutions, and changes can be made without departing from the gist of the present disclosure. These embodiments and modifications fall within the scope and gist of the present disclosure, as well as within the scope of the disclosure and its equivalent.

For example, the signals transmitted and received by the semiconductor integrated circuit are not limited to differential signals, and single-ended signals may be used. A communication system different from an AMI system may be adopted.

An apparatus including the semiconductor integrated circuit is not limited to the air conditioning device, and any other apparatus, such as a telephone device, a security device, an audio device, a video device, and a communication device, may be adopted. The semiconductor integrated circuit may be an IC having only a power supply function of extracting a DC voltage from wiring and supplying the current to a load, or an IC having, in addition to the above power supply function, other functions such as a function of transmitting or receiving signals with other communication partners via wiring.

In the present disclosure, power efficiency between the input and output of a semiconductor integrated circuit can be improved.

What is claimed is:

1. A semiconductor integrated circuit comprising:
a first power input terminal;
a second power input terminal;
a first power output terminal;
a first power line coupling the first power input terminal and the first power output terminal;
a first AC filter provided on the first power line;
a first backflow prevention circuit provided on the first power line between the first AC filter and the first power output terminal;
a bypass line that bypasses the first backflow prevention circuit;
a charge pump circuit provided on the bypass line; and
a control circuit configured to operate the charge pump circuit such that a current flows into the bypass line and the first power output terminal, when an input voltage between the first power input terminal and the second power input terminal is lower than a first threshold voltage.

2. The semiconductor integrated circuit according to claim 1, wherein the control circuit is configured to stop operating the charge pump circuit such that the current flows into the bypass line and the first power output terminal, when the input voltage is higher than the first threshold voltage.

3. The semiconductor integrated circuit according to claim 2, wherein the control circuit is configured to shut off the bypass line when the input voltage is higher than the first threshold voltage.

4. The semiconductor integrated circuit according to claim 1, wherein the control circuit is configured to:
detect an internal current flowing between the first power input terminal and the second power input terminal, and
operate the charge pump circuit such that the current flows into the bypass line and the first power output terminal, when the internal current is smaller than a first threshold current due to a decrease in the input voltage.

5. The semiconductor integrated circuit according to claim 4, wherein the control circuit is configured to stop operating the charge pump circuit such that the current flows into the bypass line and the first power output terminal, when the internal current is larger than the first threshold current.

6. The semiconductor integrated circuit according to claim 5, wherein the control circuit is configured to shut off the bypass line, when the internal current is larger than the first threshold current.

7. The semiconductor integrated circuit according to claim 1, further comprising:
a bypass switch provided on the bypass line between the first AC filter and the charge pump circuit,
wherein the control circuit is configured to turn the bypass switch on, when the input voltage is lower than the first threshold voltage.

8. The semiconductor integrated circuit according to claim 7, further comprising:
a terminal for capacitive element connection that is coupled between the bypass switch and an input portion of the charge pump circuit.

9. The semiconductor integrated circuit according to claim 1, further comprising:
a second power output terminal;
a second power line coupling the second power input terminal and the second power output terminal; and
a second AC filter provided on the second power line.

10. The semiconductor integrated circuit according to claim 9, further comprising:
a second backflow prevention circuit provided on the second power line between the second AC filter and the second power output terminal.

11. A bus system comprising:
the semiconductor integrated circuit of claim 1; and
a pair of wiring lines including
a first wiring line electrically coupled to the first power input terminal, and
a second wiring line electrically coupled to the second power input terminal.

12. An apparatus comprising:
a semiconductor integrated circuit; and
a load to which power is configured to be supplied from the semiconductor integrated circuit,
wherein the semiconductor integrated circuit includes:
a first power input terminal;
a second power input terminal;
a first power output terminal electrically coupled to the load;
a first power line coupling the first power input terminal and the first power output terminal;

a first AC filter provided on the first power line;
a first backflow prevention circuit provided on the first
    power line between the first AC filter and the first
    power output terminal;
a bypass line that bypasses the first backflow preven-
    tion circuit;
a charge pump circuit provided on the bypass line; and
a control circuit configured to operate the charge pump
    circuit such that a current flows into the bypass line
    and the first power output terminal, when an input
    voltage between the first power input terminal and
    the second power input terminal is lower than a first
    threshold voltage.

\* \* \* \* \*

16